US008021205B2

(12) United States Patent
Lee et al.

(10) Patent No.: US 8,021,205 B2
(45) Date of Patent: Sep. 20, 2011

(54) ORGANIC LIGHT-EMITTING DIODE DISPLAY DEVICE AND METHOD OF MANUFACTURING THE SAME

(75) Inventors: Joo-Hyeon Lee, Yongin-si (KR); Chang-Woong Chu, Suwon-si (KR); Chang-Mo Park, Seoul (KR); Won-Hoe Koo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 200 days.

(21) Appl. No.: 12/354,371

(22) Filed: Jan. 15, 2009

(65) Prior Publication Data

US 2009/0206739 A1    Aug. 20, 2009

(30) Foreign Application Priority Data

Feb. 18, 2008  (KR) .................................. 2008-14319

(51) Int. Cl.
  *H05B 33/04* (2006.01)
  *H01L 51/40* (2006.01)
(52) U.S. Cl. ........................................ 445/25; 313/512

(58) Field of Classification Search .................. 313/512, 313/504; 445/25

See application file for complete search history.

(56) References Cited

U.S. PATENT DOCUMENTS

| 2006/0159840 A1* | 7/2006 | Ikagawa ............................ 427/66 |
| 2006/0284556 A1* | 12/2006 | Tremel et al. .................. 313/512 |
| 2007/0170839 A1* | 7/2007 | Choi et al. ...................... 313/500 |
| 2009/0206738 A1* | 8/2009 | Koo et al. ....................... 313/504 |

FOREIGN PATENT DOCUMENTS

| JP | 2002-280169 A | 9/2002 |
| KR | 100671645 B1 | 1/2007 |
| KR | 100712177 B1 | 4/2007 |

* cited by examiner

*Primary Examiner* — Karabi Guharay
(74) *Attorney, Agent, or Firm* — Cantor Colburn LLP

(57) ABSTRACT

An organic light-emitting diode ("OLED") device includes an organic light-emitting substrate part and a protective cover part. The organic light-emitting substrate part includes a base substrate and an OLED display portion formed on the base substrate to display an image. The protective cover part includes a first frit glass disposed on the OLED display portion to cover the OLED display portion, and a second frit glass formed around a periphery of the first frit glass. The second frit glass is connected to the first frit glass.

13 Claims, 9 Drawing Sheets

ORGANIC LIGHT-EMITTING DIODE DISPLAY DEVICE AND METHOD OF MANUFACTURING THE SAME

This application claims priority to Korean Patent Application No. 2008-14319, filed on Feb. 18, 2008, and all the benefits accruing therefrom under 35 U.S.C. §119, the contents of which in its entirety are herein incorporated by reference.

BACKGROUND OF THE INVENTION

1. Field of the Invention

The present invention relates to a display device and a method of manufacturing the display device. More particularly, the present invention relates to an organic light-emitting diode ("OLED") display device including OLEDs and a method of manufacturing the OLED display device.

2. Description of the Related Art

An organic light-emitting diode ("OLED") display device typically includes a base substrate, an OLED display portion formed on the base substrate to display an image thereon, and a cover substrate disposed opposite to, e.g., facing, the base substrate.

The OLED display portion generally includes a plurality of unit pixels, and each unit pixel of the plurality of unit pixels includes an OLED which displays a particular color, for example. Generally, the OLED display portion is easily adversely affected by external moisture entering the OLED display device or external impact, for example.

In order to protect the OLED display portion from the external moisture, a space between the base substrate and the cover substrate is sealed using frit glass cured by a laser beam, for example. Specifically, the frit glass is formed along an outline, e.g., a periphery, of the cover substrate and is combined with the base substrate to protect the OLED display portion from the external moisture.

As a size of the cover substrate increases, however, a middle portion of the cover substrate sags under an increasing load applied to the OLED display portion due to the increased size of the cover substrate. As a result, the cover substrate impacts the OLED display portion.

In addition, gas generated in a process of curing the frit glass with the laser beam has a negative influence on the OLED display portion.

Because of the abovementioned disadvantages, the typical OLED display portion is required to be covered by a separate protective layer which protects the OLED display portion from impact by the cover substrate and the gas generated from curing the frit glass.

As a result, manufacturing costs of the OLED display device increase and manufacturing processes of the OLED display device are complicated, since the OLED display device is required to include the cover substrate and the protective layer.

Thus, a need exists to develop an OLED display device which overcomes the aforementioned problems.

BRIEF SUMMARY OF THE INVENTION

Exemplary embodiments of the present invention obviate the problems described above. In particular, exemplary embodiments of the present invention provide an organic light-emitting diode ("OLED") display device which protects an OLED display portion thereof and, as a result, includes reduced manufacturing costs, among other advantages.

Exemplary embodiments of the present invention also provide a method of manufacturing the OLED display device having the above-mentioned advantages.

An OLED display device according to an exemplary embodiment of the present invention includes an organic light-emitting substrate part and a protective cover part.

The organic light-emitting substrate part includes a base substrate and an OLED display portion formed on the base substrate to display an image. The protective cover part includes a first frit glass disposed on the OLED display portion to cover the OLED display portion and a second frit glass formed around a periphery of the first frit glass. The second frit glass is connected to the first frit glass.

The first and second frit glasses have a moisture permeation resistance. The first frit glass and the second frit glass may each include substantially a same material. Each of the first frit glass and the second frit glass may include frit powder particles and filler particles interposed between the frit powder particles.

The organic light-emitting substrate part may further include a protective layer formed between the OLED display portion and the first frit glass to cover and protect the OLED display portion.

The protective cover part may further include a frit cover layer formed on the first frit glass and the second frit glass.

In an alternative exemplary embodiment of the present invention, a method of manufacturing an OLED display device includes forming an organic light-emitting substrate part by forming a base substrate and then forming an OLED display portion on the base substrate to display an image thereon. Then, a protective cover part is formed, the protective cover part including a first frit glass disposed on the OLED display portion to cover the OLED display portion and a second frit glass formed around a periphery of the first frit glass and connected to the first frit glass.

To form the protective cover part, a cover substrate is formed, and the first frit glass and the second frit glass are then formed on the cover substrate. The cover substrate may then be connected to the organic light-emitting substrate part such that the first frit glass covers the OLED display portion. Thereafter, the cover substrate may be separated from the first frit glass and the second frit glass.

To form the first frit glass and the second frit glass, a first frit paste may be formed on the cover substrate, and then a second frit paste may be formed on the cover substrate around a periphery of the OLED display portion defined by the first frit paste. Thereafter, the first frit paste and the second frit paste may be dried and fired to form the first frit glass and the second frit glass, respectively. The forming the first frit glass and the forming the second frit glass may further comprise partially curing the second frit glass and completely curing the first frit glass by applying a laser beam to a boundary area between the first frit glass the second frit glass, the boundary area including only a portion of the second frit glass such that only the portion of the second frit glass included in the boundary area is cured, and applying the laser beam to an entire area of the first frit glass to cure the entire area of the first frit glass.

The first frit paste and the second frit paste may each include frit powder particles, binder particles interposed between the frit powder particles and filler particles interposed between the frit powder particles. The forming the first frit glass and the forming the second frit glass may each further comprise dissolving the frit powder particles, the binder particles and the filler particles using a solvent.

To dry and fire the first frit paste and the second frit paste, the first frit paste and the second frit paste may each be dried at a first temperature to remove the solvent therefrom. Then, the first frit paste and the second frit paste, from which the solvent is removed, may each be fired at a second temperature greater than the first temperature to remove the binder particles therefrom.

In an exemplary embodiment of the present invention, the first temperature has a range of approximately 180° C. to approximately 220° C., and the second temperature has a range of approximately 400° C. to approximately 600° C.

To connect the cover substrate to the organic light-emitting substrate part, the cover substrate may be aligned with the organic light-emitting substrate part such that the first frit glass covers the OLED display portion. Then, a laser beam may be applied to the second frit glass to connect the second frit glass to the base substrate.

When the protective cover part is formed, a frit cover layer may be formed between the cover substrate and each of the first frit glass and the second frit glass. Further, the cover substrate maybe separated from the first frit glass and the second frit glass after a laser beam is irradiated onto an entire area of the frit cover layer.

In an exemplary embodiment, the frit cover layer may include a single layer having one of an inorganic insulation layer and a metal layer.

In an alternative exemplary embodiment, the frit cover layer may include a double layer including an inorganic insulation layer and a metal layer. In this case, the metal layer may be formed on the cover substrate, and the inorganic insulation layer may be formed between the metal layer and each of the first frit glass and the second frit glass.

A thickness of the second frit glass may be greater than a corresponding thickness of the first frit glass.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
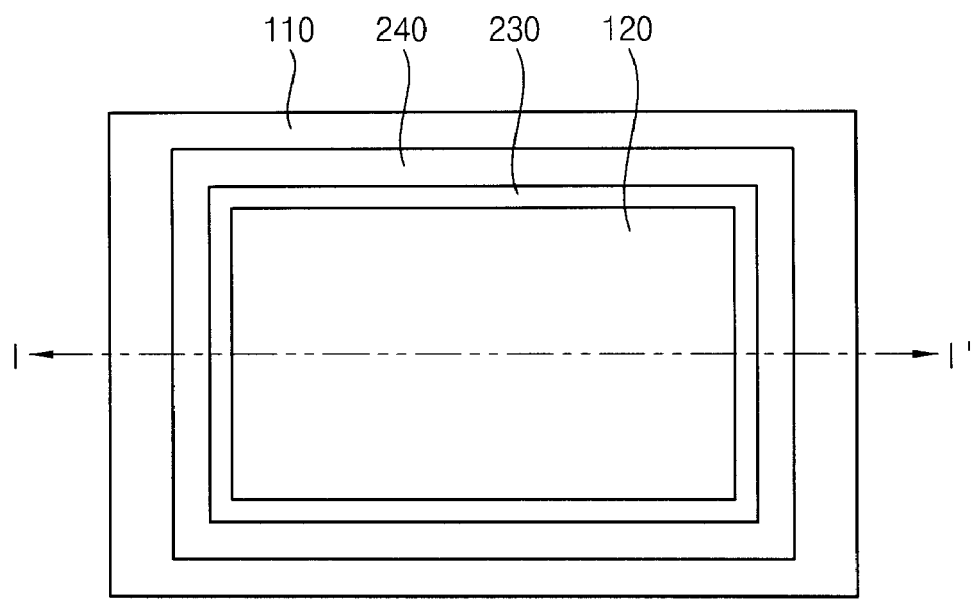
FIG. 1 is a plan view illustrating an organic light-emitting diode ("OLED") display device according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to the accompanying drawings.

Figure 2:
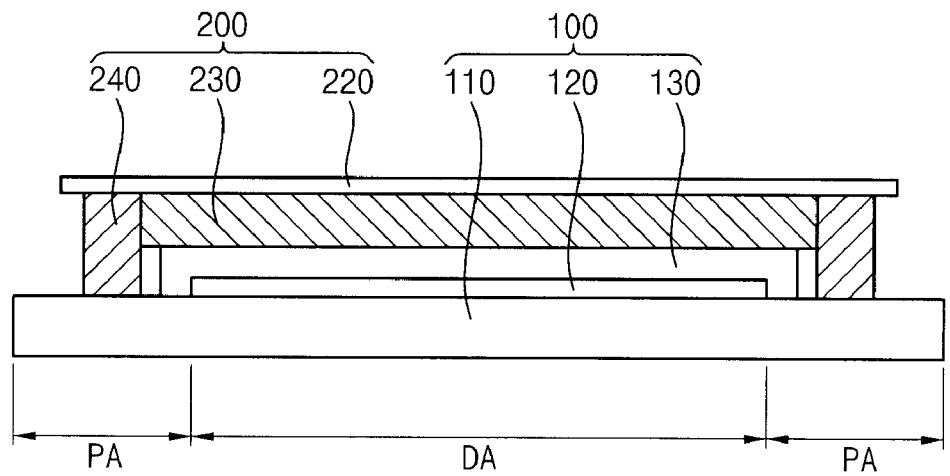
FIGS. 2 and 3 are partial cross-sectional views taken along line I-I' in FIG. 1.
Figure 3:
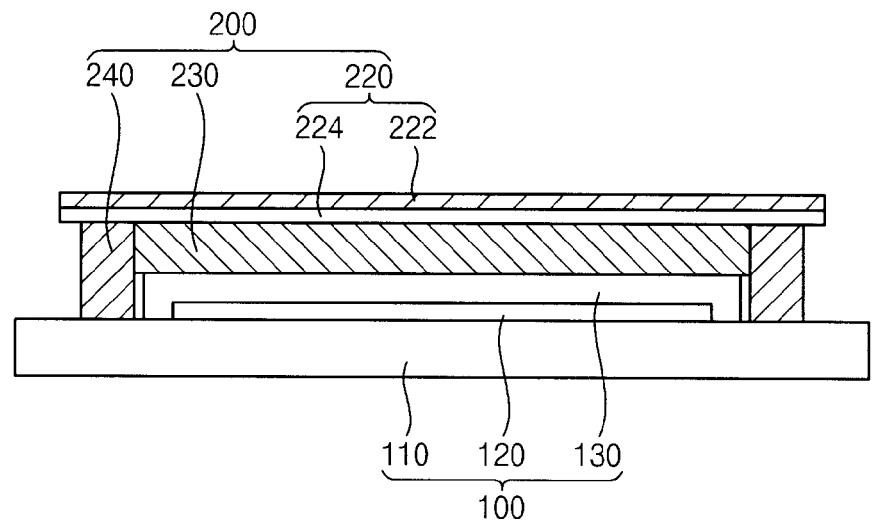

FIG. 1 is a plan view illustrating an organic light-emitting diode ("OLED") display device according to an exemplary embodiment of the present invention. FIGS. 2 and 3 are partial cross-sectional views taken along line I-I' in FIG. 1.

Referring to FIGS. 1 and 2, an OLED display device according to an exemplary embodiment of the present invention includes an organic light-emitting substrate part 100 which displays an image and a protective cover part 200 which protects the organic light-emitting substrate part 100.

The organic light-emitting substrate part 100 includes a base substrate 110 and an OLED display portion 120 formed on the base substrate 110 to display the image thereon.

In an exemplary embodiment, the base substrate 110 has a plate shape, e.g., a substantially rectilinear shape as shown in FIG. 1, and includes transparent glass, for example, but alternative exemplary embodiments are not limited thereto. Further, the base substrate 110 may include, for example, potassium lime glass, soda lime glass or quartz glass, but alternative exemplary embodiments are not limited thereto.

The base substrate 110 includes a display area DA in which the image is displayed, and a peripheral area PA substantially enclosing a periphery of the display area DA. As shown in FIG. 1, the peripheral area PA is formed substantially along an outline, e.g., a periphery, of the base substrate 110.

The OLED display portion 120 is formed on the base substrate 110 substantially corresponding to a location of the display area DA. The OLED display portion 120 includes a plurality of unit pixels (not shown) to display the image.

In an exemplary embodiment, the organic light-emitting substrate part 100 may further include a protective layer 130 formed on the base substrate 110 to cover the OLED display portion 120, as shown in FIG. 2. The protective layer 130 may completely cover the OLED display portion 120 to protect the OLED display portion 130 or, alternatively, may cover a portion of the OLED display portion 120. In an exemplary embodiment, the protective layer 130 includes an inorganic insulation layer, for example, but alternative exemplary embodiments are not limited thereto.

Figure 4:
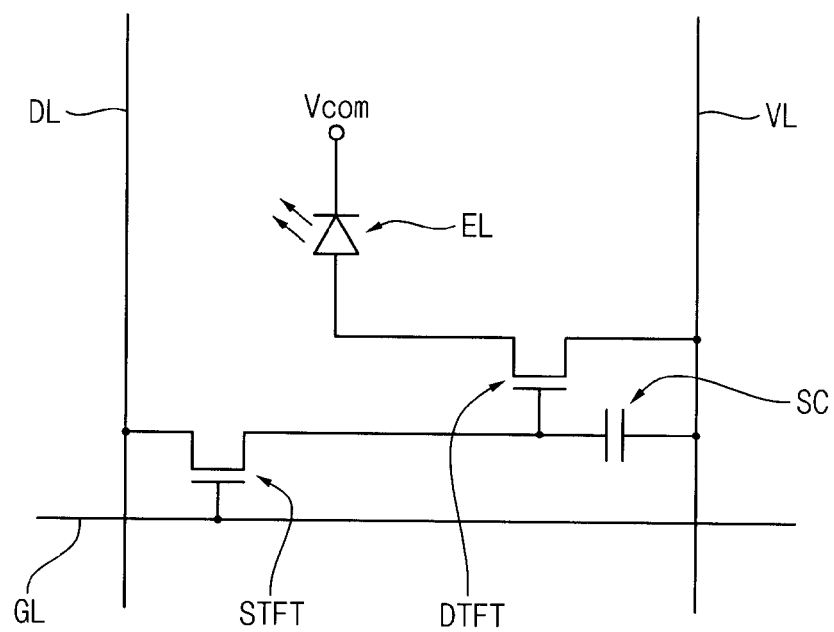
FIG. 4 is a schematic circuit diagram illustrating a unit pixel of an OLED display portion of the OLED display device according to the exemplary embodiment of the present invention shown in FIG. 1.

FIG. 4 is a schematic circuit diagram illustrating a unit pixel of an OLED display portion of the OLED display device according to the exemplary embodiment of the present invention shown in FIG. 1.

Referring to FIG. 4, each unit pixel (not shown) of the OLED display portion includes a gate line GL, a data line DL, a switching transistor STFT, a driving transistor DTFT, a bias line VL, an OLED EL and a storage capacitor SC.

The gate line GL is formed in a first direction, such as a substantially row or horizontal direction as viewed in FIG. 4, and the data line DL is formed in a second direction substantially perpendicular to, e.g., crossing, the first direction in a substantially column or vertical direction, as shown in FIG. 4. Further, the bias line VL may be formed to be substantially parallel to the data line DL formed in the second direction.

The switching transistor STFT is electrically connected to the gate line GL, the data line DL and the driving transistor DTFT. Particularly, a gate electrode of the switching transistor STFT is connected to the gate line GL, a source electrode of the switching transistor STFT is connected to the data line DL, and a drain electrode of the switching transistor STFT is connected to the driving transistor DTFT, as shown in FIG. 4.

The driving transistor DTFT is electrically connected to the drain electrode of the switching transistor STFT, the bias line VL and the OLED EL. Specifically, a gate electrode of the driving transistor DTFT is connected to the drain electrode of the switching transistor STFT, a source electrode of the driving transistor DTFT is connected to the bias line VL, and a drain electrode of the driving transistor DTFT is connected to the OLED EL.

The OLED EL is electrically connected to the drain electrode of the driving transistor DTFT and a common voltage terminal Vcom. More specifically, a first electrode of the OLED EL is connected to the drain electrode of the driving transistor DTFT, and a second electrode of the OLED EL is connected to the common voltage terminal Vcom.

In an exemplary embodiment of the present invention, the storage capacitor SC is electrically connected between the gate electrode of the driving transistor DTFT and the bias line VL, as illustrated in FIG. 4. Thus, a first electrode of the storage capacitor SC may be connected to the gate electrode of the driving transistor DTFT, and a second electrode of the storage capacitor SC may be connected to the bias line VL.

An operating principle of the unit pixel will now be described in further detail with reference to FIG. 4. When a gate signal is applied to the gate line GL to turn on the switching transistor STFT, a data signal from the data line DL is applied to the gate electrode of the driving transistor DTFT. The data signal is stored in the storage capacitor SC to turn on the driving transistor DTFT for one frame, and thus a driving current is applied from the bias line VL to the OLED EL, and the OLED EL thereby emits light to display the image.

Referring again to FIGS. 1 and 2, the protective cover part 200 according to an exemplary embodiment of the present invention includes a first frit glass 230 covering the OLED display portion 120 and a second frit glass 240 formed substantially around the first frit glass 230.

In an exemplary embodiment, the first frit glass 230 is disposed on the OLED display portion 120 to completely cover the OLED display portion 120, as shown in FIG. 1. Further, the first frit glass 230 contacts an upper surface of the protective layer 130 (best shown in FIG. 2) and covers the OLED display portion 120. A lower surface of the first frit glass 230 which contacts the upper surface of the protective layer 130 is substantially flat and smooth in an exemplary embodiment of the present invention.

The second frit glass 240 is disposed on the base substrate 110 corresponding to the peripheral area PA, and is connected to the base substrate 110. Further, the second frit glass 240 is formed around the first frit glass 230, and is also connected to the first frit glass 230, as shown in FIG. 2.

In an exemplary embodiment, a thickness of the second frit glass 240 is greater than a corresponding thickness of the first frit glass 230. For example, in an exemplary embodiment, the first frit glass 230 may have a thickness in a range of approximately 10 μm to approximately 50 μm, while the second frit glass 240 may have a thickness in a range of approximately 15 μm to approximately 100 μm. Thus, a range of a thickness difference between the first frit glass 230 and the second frit glass 240 may be approximately 5 μm to approximately 50 μm. Further, the second frit glass 240 according to an exemplary embodiment may have a width of, approximately 0.5 mm to approximately 2 mm, for example, such as approximately 1 mm, but alternative exemplary embodiments are not limited thereto.

The protective cover part 200 may further include a frit cover layer 220 formed on the first frit glass 230 and the second frit glass 240 to cover the first frit glass 230 and the second frit glass 240. In an exemplary embodiment of the present invention for example, the frit cover layer 220 includes a single layer having an inorganic insulation layer or, alternatively, a metal layer.

Referring now to FIG. 3, the frit cover layer 220 according to an alternative exemplary embodiment of the present invention includes a double layer including an inorganic insulation layer 224 and a metal layer 222.

The inorganic insulation layer 224 may be formed on the first frit glass 230 and the second frit glass 240, while the metal layer 222 may be formed on the inorganic insulation layer 224. Alternatively, the metal layer 222 may be formed on the first frit glass 230 and the second frit glass 240, and the inorganic insulation layer 224 may be formed on the metal layer 222.

Referring again to FIGS. 1 and 2, the first frit glass 230 and the second frit glass 240 shield the OLED display portion 120 from outside elements and/or contaminants, such as external moisture, for example, to effectively protect the OLED display portion 120 from the same. As a result, in an OLED display device according to an exemplary embodiment of the present invention, the first frit glass 230 and the second frit glass 240 water permeation resistance which effectively blocks the external moisture, or other contaminants, from infiltrating into the OLED display portion 120.

In an exemplary embodiment, the first frit glass 230 and the second frit glass 240 may have substantially a same thermal expansion coefficient as the base substrate 110. Further, the first frit glass 230 and the second frit glass 240 may each absorb a laser beam having a wavelength of approximately 800 nm to approximately 820 nm. Melting points of the first frit glass 230 and the second frit glass 240 in an exemplary embodiment range of approximately 400° C. to approximately 500° C., but alternative exemplary embodiments are not limited thereto.

In an exemplary embodiment of the present invention, the first frit glass 230 and the second frit glass 240 include a plurality of frit powder particles (not shown), frit powder particles of the plurality of frit powder particles being combined with each other, and a plurality of filler particles (not shown), filler particles of the plurality of filler particles being interposed between the frit powder particles. A concentration of the filler particles in each of the first frit glass 230 and the second frit glass 240 is in a range of approximately 10% by weight to approximately 30% by weight.

The filler particles are interposed between the frit powder particles to reduce a water reactivity of the first frit glass 230 and the second frit glass 240, and/or to reduce a thermal expansion coefficient of the first frit glass 230 and the second frit glass 240. In an exemplary embodiment of the present invention, the filler particles include a crystalline material such as eucryptite, cordierite, lepidolite or spodumene, for example, but alternative exemplary embodiments are not limited thereto.

The frit powder particles may include vanadium oxide ("$V_2O_5$") and/or phosphorous oxide ("$P_2O_5$"), for example. In an exemplary embodiment, the frit powder may include vanadium oxide ("$V_2O_5$") in a range of approximately 20% by weight to approximately 45% by weight, and phosphorous oxide ("$P_2O_5$") in a range of approximately 20% by weight to approximately 30% by weight.

In an alternative exemplary embodiment, the frit powder particles may further include zinc oxide ("ZnO"), bismuth oxide ("$Bi_2O_3$"), boron oxide ("$B_2O_3$"), iron oxide ("$Fe_2O_3$"), aluminum oxide ("$Al_2O_3$") and/or silicon oxide ("$SiO_2$"), for example.

Further, the frit powder particles may include a first oxidized substance which increases an adhesive strength and a second oxidized substance which stabilizes glass. Examples of the first oxidized substance include lithium oxide ("$Li_2O$"), sodium oxide ("$Na_2O$"), potassium oxide ("$K_2O$") and cesium oxide ("$Cs_2O$"), for example, while examples of the second oxidized substance include magnesium oxide ("MgO"), calcium oxide ("CaO"), strontium oxide ("SrO") and barium oxide ("BaO"), for example.

Thus, as described above, the protective cover part 200 including the first frit glass 230 and the second frit glass 240 having water permeation resistance is disposed on the base substrate 110 to completely cover the OLED display portion 120. Thus, the first frit glass 230 and the second frit glass 240 effectively shield the OLED display portion 120 from the external moisture and/or other contaminants to effectively protect the OLED display portion 120 from the same. As a result, a cover substrate for protecting the OLED display portion may be omitted in the OLED display device according to an exemplary embodiment of the present invention.

Hereinafter, a method of manufacturing an OLED display device according to an exemplary embodiment of the present invention will be described in further detail with reference to FIGS. 5 through 15. The same reference characters in FIGS. 5 through 15 refer to the same or like components as described above with respect to FIGS. 1 through 4, and any repetitive detailed description thereof will hereinafter be omitted.

Figure 5:
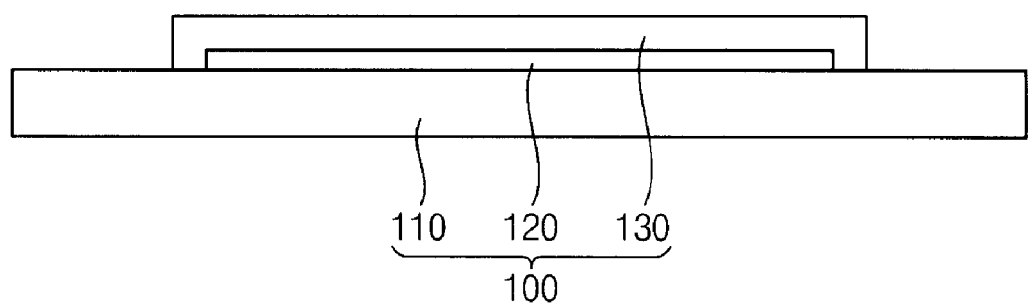
FIG. 5 is a partial cross-sectional view illustrating a process of forming an organic light-emitting substrate part of the OLED display device according to the exemplary embodiment of the present invention shown in FIG. 1.

FIG. 5 is a partial cross-sectional view illustrating a process of forming an organic light-emitting substrate part of the OLED display device according to the exemplary embodiment of the present invention shown in FIG. 1.

Referring to FIG. 5, the OLED display portion 120 is formed on the base substrate 110 corresponding to the display area DA (FIG. 2). The OLED display portion 120 according to an exemplary embodiment of the present invention may include a plurality of layers formed through a plurality of deposition and etching processes.

Then, the protective layer 130 is formed on the base substrate 110 to cover the OLED display portion 120. In an exemplary embodiment of the present invention, the protective layer 130 may be omitted.

Figure 6:
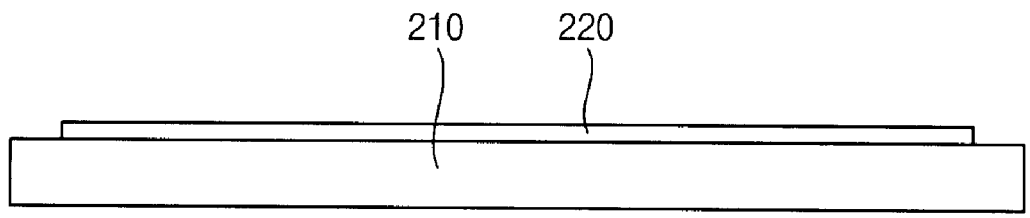
FIGS. 6 and 7 are partial cross-sectional views illustrating a process of forming a frit cover layer on a cover substrate of an OLED display device according to an exemplary embodiment of the present invention.
Figure 7:
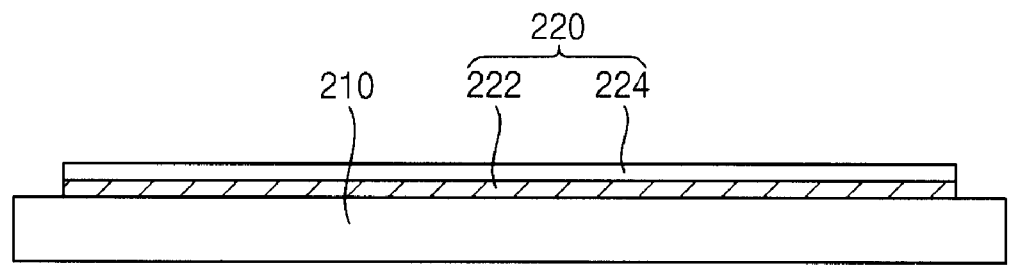

FIGS. 6 and 7 are partial cross-sectional views illustrating a process of forming a frit cover layer on a cover substrate of an OLED display device according to an exemplary embodiment of the present invention.

Referring to FIGS. 6 and 7, the frit cover layer 220 is formed on a cover substrate 210.

In an exemplary embodiment, the frit cover layer 220 includes a single layer, e.g., the inorganic insulation layer 224 or the metal layer 222, or, alternatively, may include a double layer such as the inorganic insulation layer 224 and the metal layer 222.

When the frit cover layer 220 includes the double layer, the metal layer 222 may be first formed on the cover substrate 210, and thereafter the inorganic insulation layer 224 may be formed on the metal layer 222, as shown in FIG. 7, but alternative exemplary embodiments of the present invention are not limited thereto.

The cover substrate 210 according to an exemplary embodiment may have a plate shape, e.g., a substantially rectilinear shape, and may include a material such as transparent glass, for example. In addition, the cover substrate 210 may include substantially a same material as of the base substrate 110.

Figure 8:
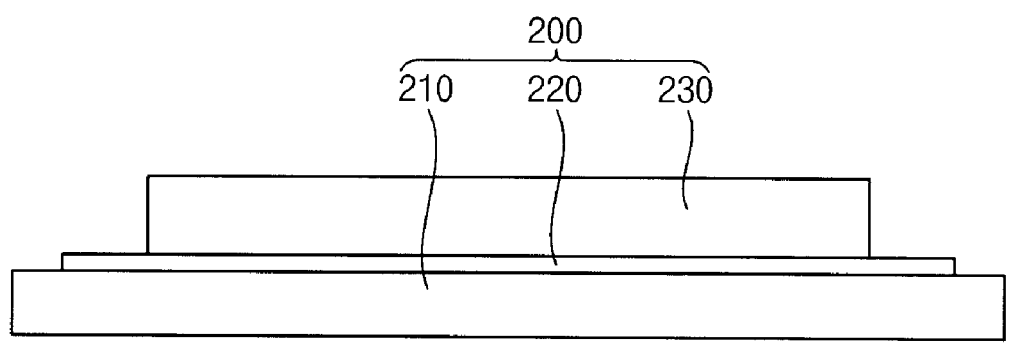
FIG. 8 is a partial cross-sectional view illustrating a process of forming a first frit glass on the frit cover layer of the OLED display device according to the exemplary embodiment of the present invention shown in FIG. 6.

FIG. 8 is a partial cross-sectional view illustrating a process of forming a first frit glass on the frit cover layer of the OLED display device according to the exemplary embodiment of the present invention shown in FIG. 6.

Referring to FIG. 8, after the frit cover layer 220 is formed, the first frit glass 230 is formed on an area of the frit cover layer 220 corresponding to the display area DA.

To form the first frit glass 230, a first frit paste is formed on the frit cover layer 220, and thereafter the first frit paste is dried and then fired to form the first frit glass 230. In an exemplary embodiment of the present invention, the first frit paste has viscosity, e.g., is a fluid.

According to an exemplary embodiment, the first frit paste is formed by using a spray unit (not shown) or, alternatively, by using a silkscreen method. The first frit paste includes a plurality of frit powder particles, a plurality of binder particles interposed between the frit powder particles, a plurality of filler particles interposed between the frit powder particles, and a solvent which dissolves the frit powder particles, the binder particles and the filler particles.

To dry and fire the first frit paste, the first frit paste is dried at a first temperature, thereby removing the solvent. Then, the first frit paste, the solvent having been removed therefrom, is fired at a second temperature, the second temperature being greater than the first temperature, to remove the binder particles. In an exemplary embodiment, an outer surface of the first frit paste is maintained substantially flat and smooth through the firing process.

According to an exemplary embodiment of the present invention, the first temperature is in range of approximately 180° C. to approximately 220° C., and may be, for example, specifically at approximately 200° C. The second temperature, on the other hand, is in a range of approximately 400° C. to approximately 600° C. and, specifically, may be in a range of approximately 450° C. to approximately 500° C., but alternative exemplary embodiments are not limited thereto.

Figure 9:
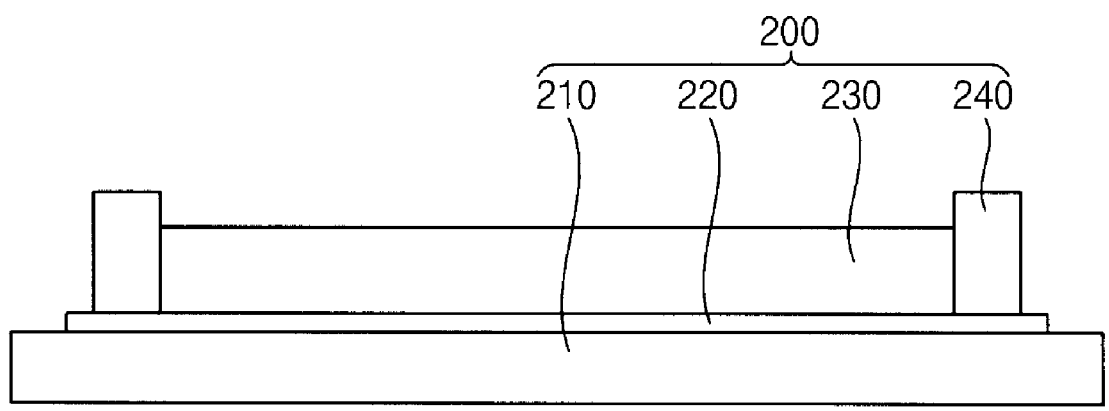
FIG. 9 is a partial cross-sectional view illustrating a process of forming a second frit glass on the frit cover layer of the OLED display device according to the exemplary embodiment of the present invention shown in FIG. 7.

FIG. 9 is a partial cross-sectional view illustrating a process of forming a second frit glass on the frit cover layer of the OLED display device according to the exemplary embodiment of the present invention shown in FIG. 7.

Referring to FIG. 9, after the first frit glass 230 is formed, the second frit glass 240 is formed substantially around the first frit glass 230.

In order to form the second frit glass 240, a second frit paste is formed on the frit cover layer 220 and is connected to an outline, e.g., a periphery, of the first frit glass 230. Thereafter, the second frit paste is dried and fired to form the second frit glass 240. In an exemplary embodiment of the present invention, the second frit paste has viscosity, e.g., is a fluid.

In an exemplary embodiment, the second frit paste is formed by using a spray unit (not shown) or, alternatively, by using a silkscreen method. In addition, the second frit paste may include substantially the same or like elements as the first frit paste.

Specifically, the second frit paste may include a plurality of frit powder particles, a plurality of binder particles interposed between the frit powder particles, a plurality of filler particles interposed between the frit powder particles, and a solvent which dissolves the frit powder particles, the binder particles and the filler particles.

To dry and fire the second frit paste, the second frit paste is first dried at the first temperature to remove the solvent therefrom. Then, the second frit paste, from which the solvent has been removed, is fired at the second temperature to remove the binder particles therefrom.

In an exemplary embodiment, after the first frit paste is dried and fired to form the first frit glass 230, the second frit paste is dried and fired to form the second frit glass 240, but alternative exemplary embodiments of the present invention are not limited thereto. For example, the first frit paste may be dried and fired to form the first frit glass 230 after the second frit paste is dried and fired to form the second frit glass 240.

In yet another alternative exemplary embodiment, the first frit paste and the second frit paste may be simultaneously dried and fired to form the first frit glass 230 and the second frit glass 240, respectively, after the first frit paste and the second frit paste are continuously formed on the frit cover layer 220.

Figure 10A:
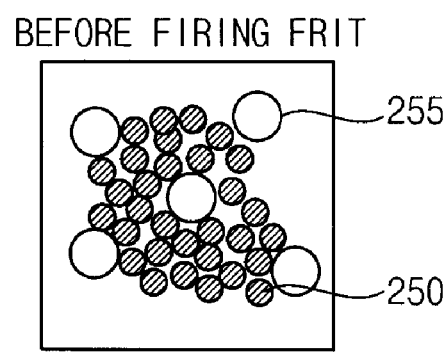
FIGS. 10A and 10B are partial cross-sectional views illustrating internal states, before and after firing, respectively, of both the first frit glass and the second frit glass of the OLED display device according to the exemplary embodiment of the present invention shown in FIGS. 8 and 9.
Figure 10B:
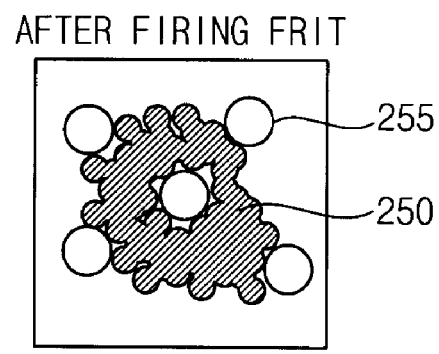

FIGS. 10A and 10B are partial cross-sectional views illustrating internal states, before and after firing, respectively, of both the first frit glass and the second frit glass according to the exemplary embodiment of the present invention shown in FIGS. 8 and 9.

Referring to FIGS. 10A and 10B, when the first frit paste and the second frit paste are dried at the first temperature (FIG. 10A) and are then fired at the second temperature (FIG. 10B), frit powder particles 250 in the first frit paste and the second frit paste are combined, e.g., an effective density of the frit powder particles 250 between filler particles 255 is increased, as shown in FIG. 10B (in comparison to as shown FIG. 10A).

Thus, although the solvent and the binder particles are removed through the drying and firing processes, the first frit glass 230 and the second frit glass 240 are densely combined, e.g., are formed without being porous, due to the combining of the frit powder particles 250 between the filler particles 255.

Figure 11:
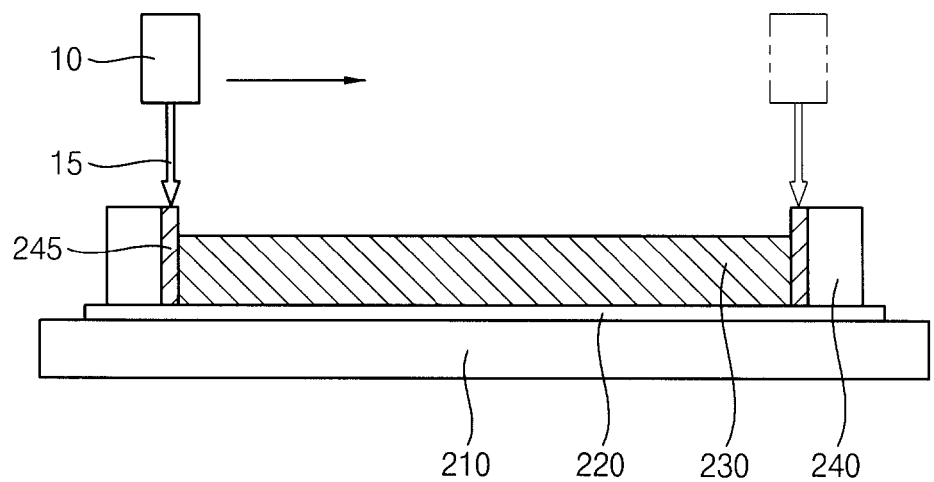
FIG. 11 is a partial cross-sectional view illustrating a process of applying a laser beam to both the first frit glass and the second frit glass of the OLED display device according to the exemplary embodiment of the present invention shown in FIG. 9.

FIG. 11 is a partial cross-sectional view illustrating a process of applying a laser beam to both the first frit glass and the second frit glass of the OLED display device according to the exemplary embodiment of the present invention shown in FIG. 9.

Referring to FIG. 11, after the first frit glass 230 and the second frit glass 240 are formed, the second frit glass 240 is partially cured, e.g., a portion of the second frit glass 240 is cured, while, in contrast, the first frit glass 230 is completely cured, e.g., the entire the first frit glass 230 is cured.

Specifically, a laser beam 15 is applied to a boundary area 245 between the first frit glass 230 and the second frit glass 240, as well as an entire area of the first frit glass 230 using a curing laser 10. Thus, a portion of the second frit glass 240, e.g., the boundary area 245, and all of the first frit glass 230 are temporarily melted by the laser beam 15 and thereafter cured again, and are thereby strongly combined with each other and with the frit cover layer 220. External moisture, e.g., external water, is effectively prevented from permeating to the interior of the OLED display portion 120, since a portion of the second frit glass 240 nearest the OLED display portion 120, e.g., the boundary area 245, as well as all of the first frit glass 230, are cured by the laser beam 15.

Figure 12:
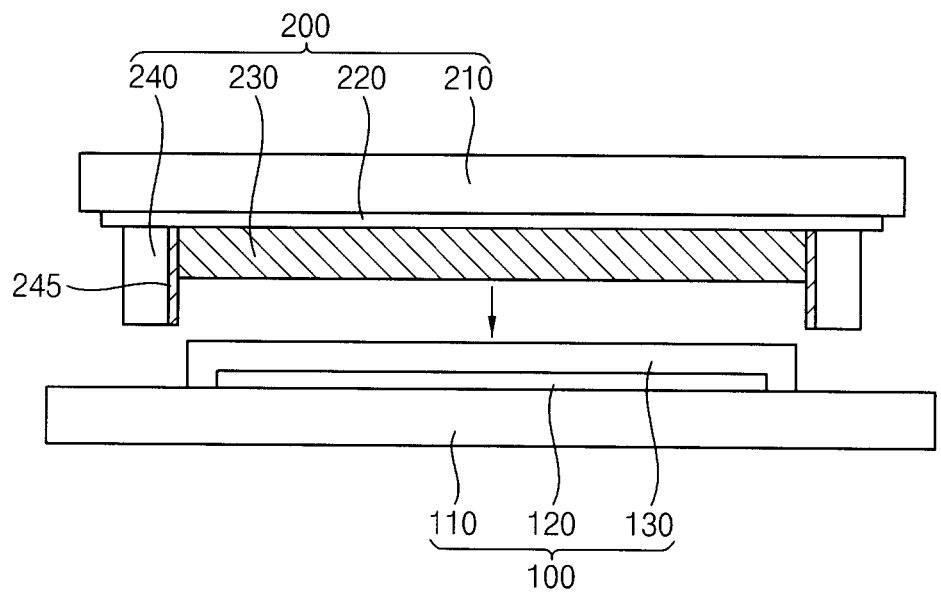
FIG. 12 is a partial cross-sectional view illustrating a process of coupling the organic light-emitting substrate part of the OLED display device according to the exemplary embodiment of the present invention shown in FIG. 5 to the protective cover part of the OLED display device according to the exemplary embodiment of the present invention shown in FIG. 11.

FIG. 12 is a partial cross-sectional view illustrating a process of coupling the organic light-emitting substrate part of the OLED display device according to the exemplary embodiment of the present invention shown in FIG. 5 to the protective cover part of the OLED display device according to the exemplary embodiment of the present invention shown in FIG. 11.

Referring to FIG. 12, after the protective cover part 200 including the cover substrate 210, the frit cover layer 220 the first frit glass 230 and the second frit glass 240 are formed, the protective cover part 200 is coupled to the organic light-emitting substrate part 100.

To couple the protective cover part 200 to the organic light-emitting substrate part 100, the protective cover part 200 is first aligned with the organic light-emitting substrate part 100 so that the OLED display portion 120 is substantially covered by the first frit glass 230.

Then, the organic light-emitting substrate part 100 and the protective cover part 200 are vacuum-compressed. When the organic light-emitting substrate part 100 and the protective cover part 200 are vacuum-compressed, the protective cover part 200 makes a strong contact with the organic light-emitting substrate part 100.

Figure 13:
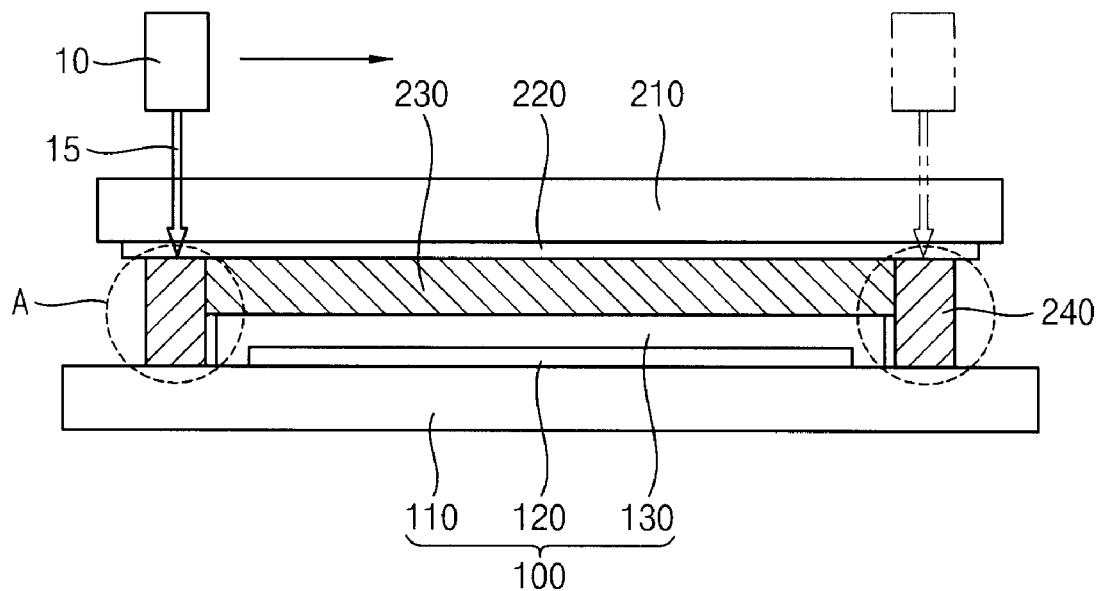
FIG. 13 is a partial cross-sectional view illustrating a process of applying a laser beam to the second frit glass of the OLED display device according to the exemplary embodiment of the present invention shown in FIG. 12.
Figure 14A:
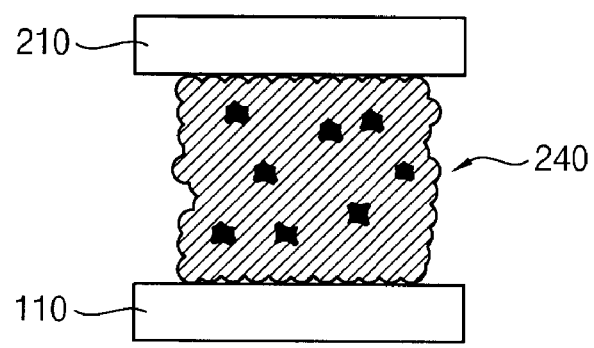
FIGS. 14A and 14B are partial cross-sectional views of area "A" in FIG. 13, illustrating internal states, before and after applying the laser beam, respectively, of the second frit glass of the OLED display device according to the exemplary embodiment of the present invention shown in FIG. 13.
Figure 14B:
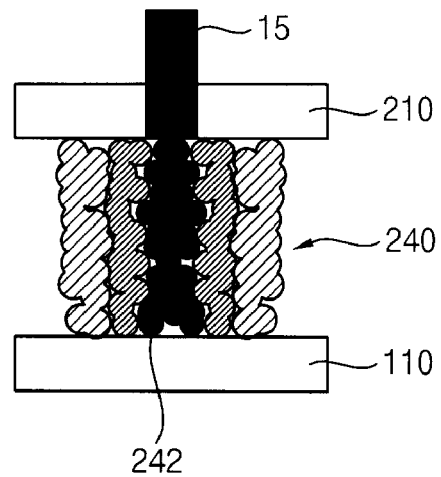

FIG. 13 is a partial cross-sectional view illustrating a process of applying a laser beam to the second frit glass of the OLED display device according to the exemplary embodiment of the present invention shown in FIG. 12. FIGS. 14A and 14B are partial cross-sectional views of area "A" in FIG. 13, illustrating internal states, before and after applying the laser beam, respectively, of the second frit glass f the OLED display device according to the exemplary embodiment of the present invention shown in FIG. 13 before and after applying the laser beam, respectively.

Referring to FIGS. 13, 14A and 14B, a laser beam 15 is applied to the second frit glass 240 to strongly couple the second frit glass 240 to the base substrate 110.

Specifically, a curing laser 10 is disposed above to the second frit glass 240, and the laser beam 15 is applied to the second frit glass 240 using the curing laser 10. When the laser beam 15 is applied to the second frit glass 240, a portion 242 of the second frit glass 240, e.g., the boundary area 245 (best shown in FIG. 11), is temporarily melted and is thereafter cured again, to be strongly combined with the base substrate 110. Thus, the OLED display portion 120 is effectively sealed by the cured first frit glass 230 and the second frit glass 240, and the OLED display device according to an exemplary embodiment of the present invention is thereby protected from the external water, e.g., moisture.

In an exemplary embodiment, the portion 242 of the second frit glass 240, to which the laser beam 15 is applied, may include an uncured portion of the second frit glass 240 that is previously not cured, such as a portion of the second frit glass opposite the boundary area 235 (best shown in FIG. 11). In an exemplary embodiment, a width of the portion 242 of the second frit glass 240, to which the laser beam 15 is applied, has a range of approximately 60% to approximately 70% of an entire width of the second frit glass 240. For example, when the entire width of the second frit glass 240 is approximately 1 mm, the width of the portion 242 of the second frit glass 240, to which the laser beam 15 is applied, has a range of approximately 0.6 mm to approximately 0.7 mm.

In an exemplary embodiment, the curing laser 10 is a diode laser, and a wavelength of the laser beam 15 is in a range of approximately 800 nm to approximately 820 nm. Further, the diode laser may generate a laser beam 15 having a power level of approximately 50 W.

In an exemplary embodiment, when the laser beam 15 is applied to the second frit glass 240, gas, which has an adverse influence on the OLED display portion 120, is generated from the second frit glass 240. However, the gas does not move to the OLED display portion 120, since the boundary portion 245 between the first frit glass 230 and 240, as well as all of the first frit glass 230, are already cured. Thus, the OLED display portion 120 according to an exemplary embodiment of the present invention is effectively protected from the gas.

Figure 15:
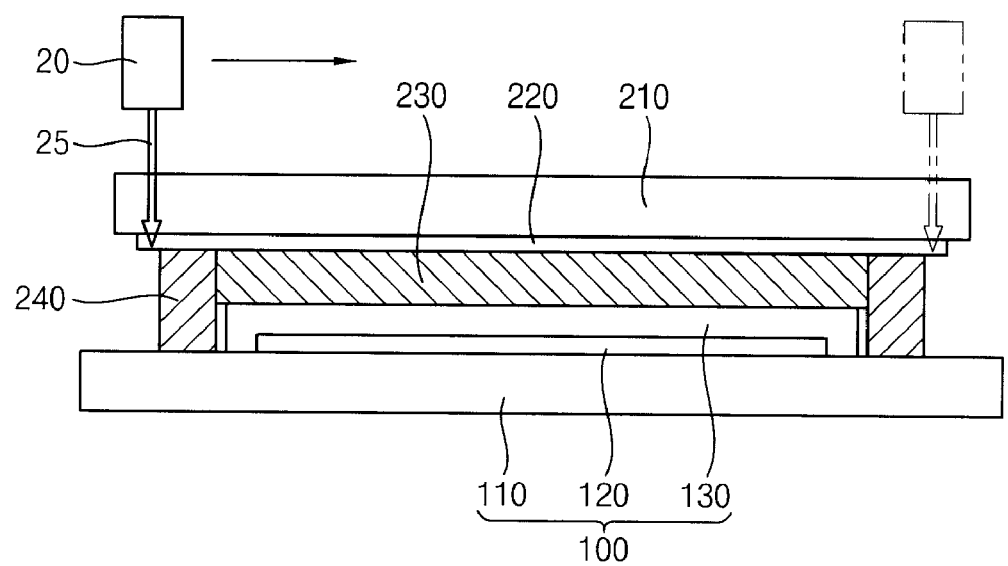
FIG. 15 is a partial cross-sectional view illustrating a process of separating the cover substrate of the OLED display device according to the exemplary embodiment of the present invention shown in FIG. 14 from the first frit glass and the second frit glass.

FIG. 15 is a partial cross-sectional view illustrating a process of separating the cover substrate of the OLED display device according to the exemplary embodiment of the present invention shown in FIG. 14 from the first frit glass and the second frit glass.

Referring to FIG. 15, after the protective cover part 200 is coupled, e.g., is connected, to the organic light-emitting substrate part 100, as described in greater detail above, the cover substrate 210 is separated from the first frit glass 230 and the second frit glass 240.

To separate the cover substrate 210 from the first frit glass 230 and the second frit glass 240, a laser beam 25 is first generated using a substrate separating laser 20 and is thereby irradiated onto an entire area of the frit cover layer 220. As a result, the cover substrate 210 is separated from the first frit glass 230 and the second frit glass 240.

In an exemplary embodiment of the present invention, the frit cover layer 220 includes a double layer including the metal layer 222 and the inorganic insulation layer 224 (best shown in FIG. 7). As a result, the metal layer 222 absorbs energy, e.g., heat, from the laser beam 25 well to easily separate the cover substrate 210 from the first frit glass 230 and the second frit glass 240.

When the laser beam 25 is applied to the frit cover layer 220, the frit cover layer 220 is temporarily transformed into a melted state, and the cover substrate 210 may thereby be easily separated from the first frit glass 230 and the second frit glass 240. The cover substrate 210, separated by the laser beam 25, may be cleaned and reused.

In an exemplary embodiment of the present invention, the substrate separating laser 20 is an neodymium-doped yttrium aluminum garnet ("Nd:YAG") laser. Further, the laser beam 25 may have a wavelength of approximately 1,050 nm to approximately 1,070 nm. Specifically, the laser beam 25 according to an exemplary embodiment has a wavelength of approximately 1,064 nm.

As described above, the first frit glass and the second frit glass of and OLED display device according to an exemplary embodiment of the present invention cover and protect the OLED display portion of the OLED display device. Thus, a cover substrate, required in an OLED display device of the prior art, may be omitted, and a manufacturing cost of the OLED display device according to an exemplary embodiment of the present invention is substantially reduced.

In addition, gas generated from the second frit glass is effectively prevented from flowing to the OLED display portion. Thus, the OLED display portion is effectively protected from the gas and adverse affects therefrom are substantially reduced and/or effectively eliminated in the OLED display device according to exemplary embodiments of the present invention.

As described and shown herein, according to exemplary embodiments of the present invention, a protective cover part including a first frit glass and a second frit glass completely covers and protects an OLED display portion of an OLED display device. Thus, a cover substrate required in an OLED display device of the prior art may be omitted in the OLED display device according to exemplary embodiments of the present invention, and manufacturing costs of the OLED display device according to exemplary embodiments of the present invention are substantially reduced.

The present invention should not be construed as being limited to the exemplary embodiments set forth herein. Rather, these exemplary embodiments are provided so that this disclosure will be thorough and complete and will fully convey the concept of the present invention to those skilled in the art.

Although exemplary embodiments of the present invention have been described herein, it will be understood by those of ordinary skill in the art that various changes and modifications in form and detail may be made therein without departing from the spirit or scope of the present invention as defined by the following claims.

What is claimed is:

1. A method of manufacturing an organic light-emitting diode display device, the method comprising:
    forming an organic light-emitting substrate part, the forming the organic light-emitting substrate part comprising:
        forming a base substrate; and
        forming an organic light-emitting diode display portion on the base substrate to display an image thereon; and
    forming a protective cover part comprising a first frit glass disposed on the organic light-emitting diode display portion to cover the organic light-emitting diode display portion and a second frit glass formed around a periphery of the first frit glass and connected to the first frit glass,
    wherein forming the protective cover part comprises:
    forming the first frit glass on a cover substrate;
    forming the second frit glass on a cover substrate;
    connecting the cover substrate to the organic light-emitting substrate part; and
    separating the cover substrate from the first frit glass and the second frit glass.

2. The method of claim 1, wherein the forming the first frit glass and the forming the second frit glass each comprises:
    forming a first frit paste on the cover substrate;
    forming a second frit paste on the cover substrate around a periphery of the organic light-emitting diode display portion defined by the first frit paste;
    drying the first frit paste and the second frit paste; and
    firing the first frit paste and the second frit paste to form the first frit glass and the second frit glass, respectively.

3. The method of claim 2, wherein the forming the first frit glass and the forming the second frit glass further comprises partially curing the second frit glass and completely curing the first frit glass by:
    applying a laser beam to a boundary area between the first frit glass and the second frit glass, the boundary area including only a portion of the second frit glass such that only the portion of the second frit glass included in the boundary area is cured, and
    applying the laser beam to an entire area of the first frit glass to cure the entire area of the first frit glass.

4. The method of claim 2, wherein the first frit paste and the second frit paste each comprises:
    frit powder particles;
    binder particles interposed between the frit powder particles; and
    filler particles interposed between the frit powder particles, wherein the forming the first frit glass and the forming the second frit glass each further comprises dissolving the frit powder particles, the binder particles and the filler particles using a solvent.

5. The method of claim 4, wherein the drying the first frit paste and the second frit paste and the firing the first frit paste and the second frit paste each comprises:
    drying the first frit paste and the second frit paste at a first temperature to remove the solvent therefrom; and
    firing the first frit paste and the second frit paste, from which the solvent is removed, at a second temperature greater than the first temperature, to remove the binder particles from the first frit paste and the second frit paste.

6. The method of claim 5, wherein
    the first temperature has a range of approximately 180° C. to approximately 220° C., and
    the second temperature has a range of approximately 400° C. to approximately 600° C.

7. The method of claim 1, wherein the connecting the cover substrate to the organic light-emitting substrate part comprises:
    aligning the cover substrate with the organic light-emitting substrate part such that the first frit glass covers the organic light-emitting diode display portion; and
    applying a laser beam to the second frit glass to connect the second frit glass to the base substrate.

8. The method of claim 1, wherein the forming the protective cover part further comprises:
    forming a frit cover layer between the cover substrate and each of the first frit glass and the second frit glass.

9. The method of claim 8, wherein forming the protective cover part further comprises, prior to separating the cover substrate from the first and second frit glasses, irradiating a laser beam onto an entire area of the frit cover layer.

10. The method of claim 9, wherein the frit cover layer includes a single layer comprising one of an inorganic insulation layer and a metal layer.

11. The method of claim 9, wherein the frit cover layer includes a double layer comprising an inorganic insulation layer and a metal layer.

12. The method of claim 11, wherein
the metal layer is formed on the cover substrate, and
the inorganic insulation layer is formed between the metal layer and each of the first frit glass and the second frit glass.

13. The method of claim 1, wherein a thickness of the second frit glass is greater than a corresponding thickness of the first frit glass.

* * * * *